US006693003B2

United States Patent
Okuda

(10) Patent No.: US 6,693,003 B2
(45) Date of Patent: Feb. 17, 2004

(54) SEMICONDUCTOR DEVICE AND MANUFACTURING METHOD OF THE SAME

(75) Inventor: Shoji Okuda, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/388,475

(22) Filed: Mar. 17, 2003

(65) Prior Publication Data

US 2003/0173610 A1 Sep. 18, 2003

Related U.S. Application Data

(62) Division of application No. 09/944,211, filed on Sep. 4, 2001, now Pat. No. 6,559,496.

(30) Foreign Application Priority Data

Apr. 12, 2001 (JP) .......................................... 2001-114009

(51) Int. Cl.[7] .......................................... H01L 21/8242
(52) U.S. Cl. ...................... 438/239; 438/241; 438/250; 438/251; 438/253; 438/393
(58) Field of Search ................... 438/238, 239, 438/240, 241, 250, 251, 252, 253, 254, 279, 381, 393, 394, 395, 396, 397

(56) References Cited

U.S. PATENT DOCUMENTS

| 5,818,079 A | 10/1998 | Noma et al. ................. 257/295 |
| 6,144,051 A | 11/2000 | Nishimura et al. .......... 257/277 |
| 6,171,901 B1 | 1/2001 | Blair et al. .................. 438/250 |
| 6,338,997 B2 | 1/2002 | Yoshikawa ................... 438/250 |
| 6,383,859 B2 * | 5/2002 | Watanabe .................... 438/239 |

FOREIGN PATENT DOCUMENTS

JP   2000-223670   8/2000

* cited by examiner

*Primary Examiner*—Jack Chen
(74) *Attorney, Agent, or Firm*—Westerman, Hattori, Daniels & Adrian, LLP

(57) ABSTRACT

In a semiconductor device, formed are a lower capacitor electrode on an element isolation film on a silicon substrate, a capacitor insulating film and an upper capacitor electrode. A silicon oxide film is formed on the entire surface of the silicon substrate. On the silicon oxide substrate, formed is a resist pattern that covers a region extending from the inside of a periphery of the upper capacitor electrode to the outside of the periphery thereof. Sidewalls that cover side faces of a gate electrode and the lower capacitor electrode, and a sidewall that covers a side face and an upper periphery of the upper capacitor electrode, are formed by performing anisotropic etching.

6 Claims, 8 Drawing Sheets

SEMICONDUCTOR DEVICE AND MANUFACTURING METHOD OF THE SAME

CROSS-REFERENCE TO RELATED APPLICATIONS

This application is a divisional of prior application Ser. No. 09/944,211 filed Sep. 4, 2001 now U.S. Pat. No. 6,559,496.

This application is based upon and claims priority of Japanese Patent Applications No. 2001-114009, filed in Apr. 12, 2001, the contents being incorporated herein by reference.

BACKGROUND OF THE INVENTION

1. Field of the Invention

The present invention relates to a semiconductor device having a capacitor constituted by stacking a lower capacitor electrode, an insulating film and an upper capacitor electrode, and a manufacturing method of the same. More specifically, the present invention relates to a semiconductor device including a silicide film in its wiring connection portion and a manufacturing method of the same.

2. Description of the Prior Art

Recently, high integration and microfabrication of semiconductor devices have been promoted, and electrode of low resistivity has been required accompanied with the promotions of them. In order to realize low resistivity of electrodes, a process of reacting silicon with metallic atoms of titanium (Ti), cobalt (Co) and the like, called a silicide process is utilized.

FIG. 1 is a sectional view of a conventional semiconductor device including a metal oxide semiconductor (hereinafter referred to as "MOS") transistor 71 with a lightly doped drain (hereinafter referred to as "LDD") structure and a stacked capacitor 72.

A manufacturing method of the conventional semiconductor device will be described with reference to FIG. 1.

First, an electrically insulative element isolation film 52 is formed on a silicon substrate 51. Thereafter, a gate insulating film 53 is formed on a transistor forming region of the silicon substrate 51.

Next, on the entire surface of the silicon substrate 51, a first polysilicon film is formed. The first polysilicon film serves as a gate electrode 54 and a lower capacitor electrode 55. On the lower capacitor electrode 55, formed are an oxide film serving as a capacitor insulating film 56 and a second polysilicon film serving as an upper capacitor electrode 57.

Thereafter, the second polysilicon film and the oxide film are respectively subjected to patterning, thus forming the upper capacitor electrode 57 and the capacitor insulating film 56. Subsequently, the first polysilicon film is subjected to patterning, thus forming the gate electrode 54 and the lower capacitor electrode 55. Thereafter, impurities are ion-implanted onto a surface of the silicon substrate 51 at a low concentration using the gate electrode 54 as a mask, thus forming a low-concentration impurity region (i.e., an LDD region) 58 in a self-aligned manner with the gate electrode 54.

Next, a silicon oxide film is formed on the entire surface of the resultant structure. Then, the silicon oxide film is subjected to anisotropic etching so that the silicon oxide film remains only on side portions of: the gate electrode 54; the lower capacitor electrode 55; and the upper capacitor electrode 57. In this way, sidewalls 59a, 59b and 59c made of silicon oxide films are formed, which cover the side portions of the gate electrode 54, the lower capacitor electrode 55 and the upper capacitor electrode 57, respectively.

Next, impurities are ion-implanted onto the surface of the silicon substrate 51 at a high concentration using the gate electrode 54 and the sidewall 59a as a mask, thus forming a high-concentration impurity region (a source/drain region) 60 in a self-aligned manner with the gate electrode 54 and the sidewall 59a.

Next, the entire surface of the resultant structure is subjected to sputtering either with Ti or Co, thus forming a metallic film. Thereafter, the substrate is subjected to annealing (a heating process) and either Ti or Co atoms contained in the metallic film react with silicon atoms contained in the gate electrode 54, the high-concentration impurity region 60, the lower capacitor electrode 55 and the upper capacitor electrode 57. Thus silicide films 61a, 61b, 61c and 61d are formed. Thereafter, the metallic film is removed.

In this way, a MOS transistor 71 of LDD structure and a stacked capacitor 72 are formed as shown in FIG. 1. Thereafter, an interlayer insulating film (not illustrated) and a wiring (not illustrated) are formed, and a desired circuit is thereby formed.

The inventors of the present invention perceive that the above-described manufacturing method of a semiconductor device has a problem as follows.

In recent years, along with the progress of high integration and microfabrication of semiconductor devices, thinning of films of the capacitor electrode (particularly for the upper capacitor electrode 57) has been required. However, when the films of the capacitor are thinned, or when metallic films for silicide formation are thickened or an annealing temperature is raised for ensuring a reaction of silicon and metallic atoms, the silicide film 61c on the lower capacitor electrode 55 extends upward along a side face of the sidewall 59c ("creeping-up"), or the silicide film 61d on the upper capacitor electrode 57 extends downward along a side face of the sidewall 59c ("creeping-down"). Such a problem may incur a short circuit or a current leakage.

SUMMARY OF THE INVENTION

An object of the present invention is to provide a semiconductor device having a capacitor, and a manufacturing method of the same, capable of preventing a short circuit and a current leakage incurred by silicide of a sidewall portion on a side of a capacitor electrode.

In order to achieve the above-mentioned object, a semiconductor device of the present invention comprises: a semiconductor substrate; an insulating film formed on the semiconductor substrate; a lower capacitor electrode formed on the insulating film; a first sidewall made of an insulating material covering a side face of the lower capacitor electrode; a capacitor insulating film formed on the lower capacitor electrode; an upper capacitor electrode formed on the capacitor insulating film; a second sidewall made of an insulating material covering a side face and an upper periphery of the upper capacitor electrode; a first silicide film formed on a portion of the lower capacitor electrode where the portion is not covered with the capacitor insulating film; and a second silicide film formed on a portion of the upper capacitor electrode where the portion is not covered with the second sidewall.

With the above-described constitution, in the semiconductor device of the present invention, since a sidewall is formed so as to cover not only the side portion of the upper capacitor electrode but also the upper periphery thereof, a distance between the silicide film on the surface of the lower capacitor electrode and the silicide film on the surface of the upper capacitor electrode (a distance along the surface of the sidewall) is made large. Accordingly, a contact of a creeping-up portion of the silicide from the lower capacitor electrode side and with a creeping-down portion of the silicide from the upper capacitor electrode side is prevented even in a case where a thickness of the upper capacitor electrode is made as thin as 80 to 180 nm. Thus, occurrence of a defect such as a short circuit or a current leakage is avoided.

Also, a manufacturing method of a semiconductor device according to the present invention comprises the steps of: forming an insulative element isolation film on a semiconductor substrate; forming a first silicon film on the entire surface of the semiconductor substrate; forming a first insulating film on the first silicon film; forming a second silicon film on the first insulating film; forming a capacitor insulating film and an upper capacitor electrode above an upper side of the element isolation film by patterning the first insulating film and the second silicon film; forming a first resist film including a first pattern that covers the upper capacitor electrode and the capacitor insulating film, and a second pattern that covers a gate electrode formation region; forming a lower capacitor electrode and a gate electrode by patterning the first silicon film by use of the first resist film as a mask; introducing first impurities onto a surface layer of the semiconductor substrate at both side portions of the gate electrode after removing the first resist film; forming a second insulating film on the entire surface of the resultant structure; forming a second resist film on the second insulating film, the second resist film covering a region extending from the inside of a periphery of the upper capacitor electrode to the outside of the periphery thereof; anisotropically etching the second insulating film to form sidewalls on a side portion of the gate electrode, a side portion of the lower capacitor electrode and a bottom portion of the second resist film, respectively; removing the second resist film; introducing second impurities onto the semiconductor substrate using the gate electrode and the sidewalls on the both sides thereof collectively as a mask; forming a metallic film on the entire surface of the resultant structure and further allowing metallic atoms in the metallic film to react with silicon contained in the semiconductor substrate, the gate electrode, the lower capacitor electrode and the upper capacitor electrode, thus forming a silicide film; and removing the metallic film while leaving the silicide film.

With the above-described constitution, in the manufacturing method of the present invention, the resist film is formed on the second insulating film, the resist film covering a region extending from the inside of the periphery of the upper capacitor electrode to the outside of the periphery thereof. Thus, the insulating film partially remains under the resist film when anisotropic etching is performed for the insulating film, and the remaining part thereof forms a sidewall on the upper capacitor electrode side.

Therefore, a side wall is formed so as to cover not only the side portion of the upper capacitor electrode but also the upper periphery thereof. As a result, a contact of a creeping-up portion of the silicide from the lower capacitor electrode side and with a creeping-down portion of the silicide from the upper capacitor electrode side is prevented. Thus, occurrence of a defect such as a short circuit or a current leakage is avoided.

DESCRIPTION OF THE PREFERRED EMBODIMENTS

Now, embodiments of the present invention will be described with reference to the accompanied drawings.

Figure 1:
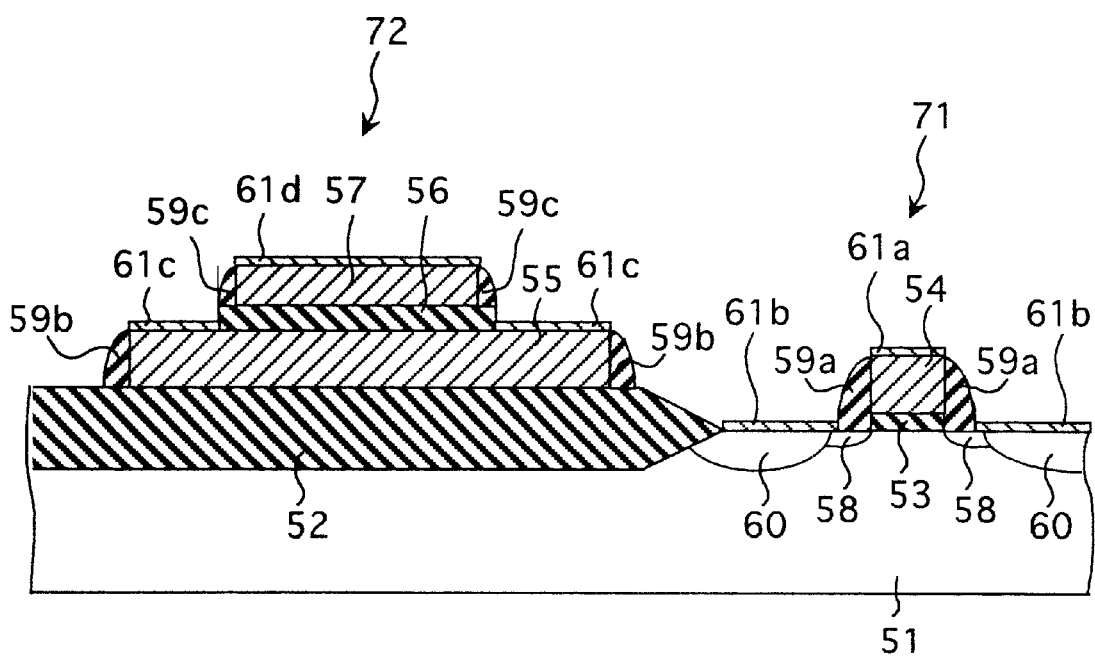
FIG. 1 is a sectional view of a conventional semiconductor device which includes a MOS transistor of an LDD structure and a stacked capacitor.
Figure 2A:
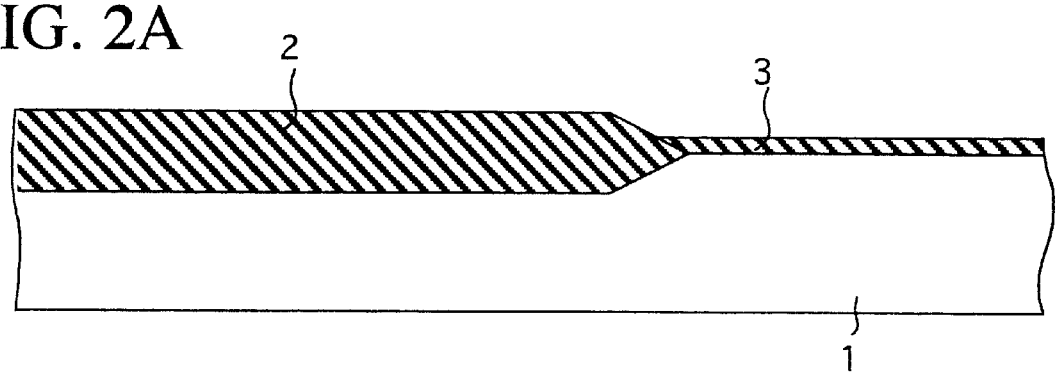
FIGS. 2A to 2R are sectional views showing a manufacturing method of a semiconductor device according to an embodiment of the present invention followed by steps.
Figure 2B:
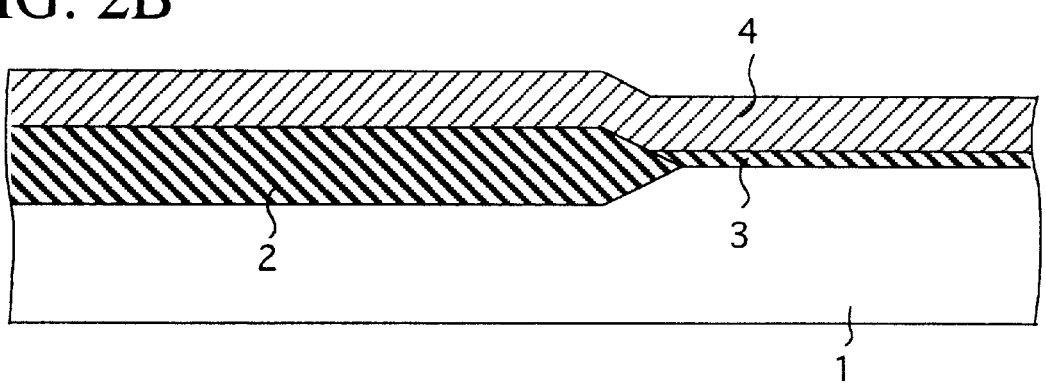
Figure 2C:
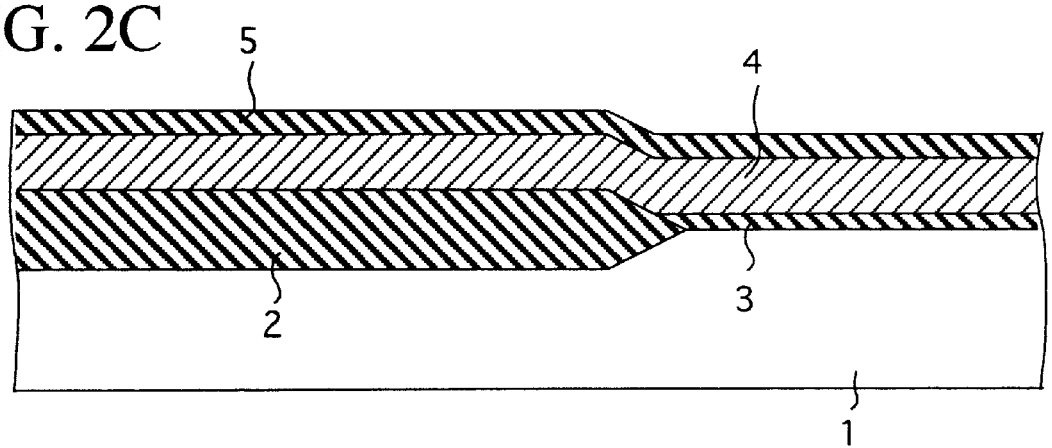
Figure 2D:
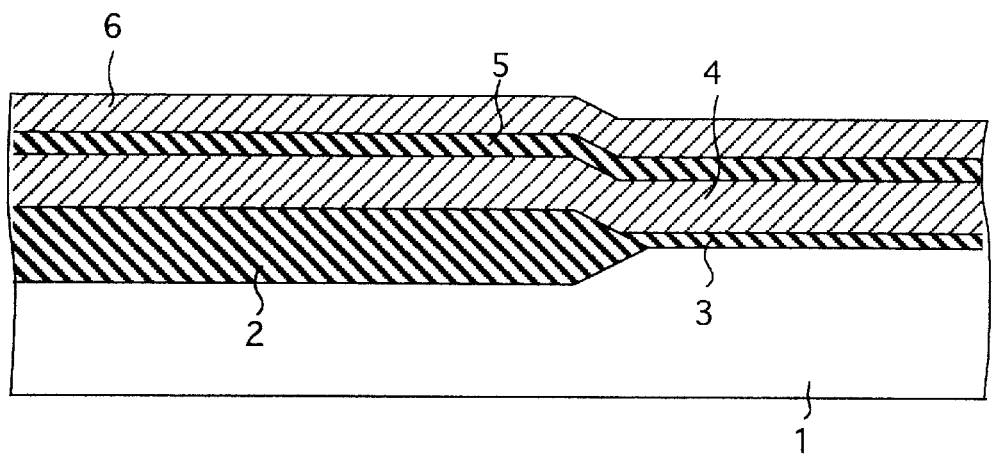
Figure 2E:
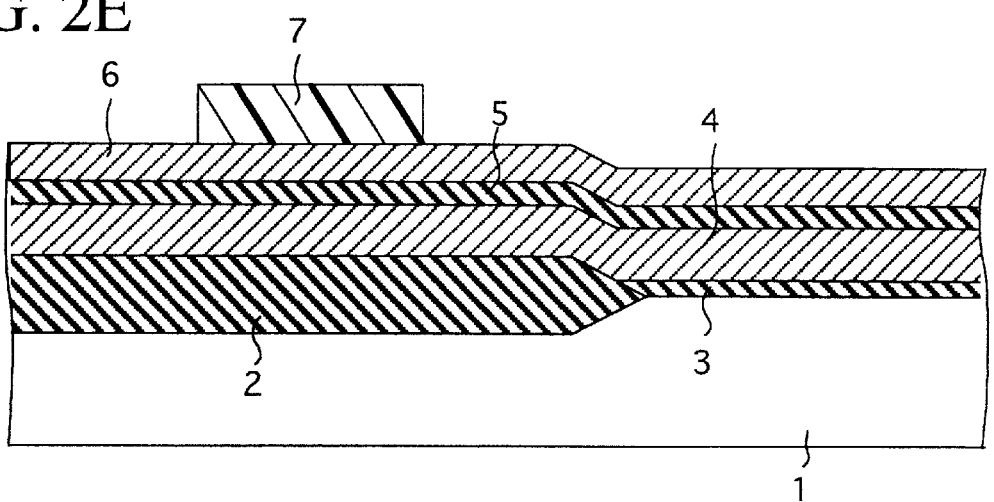
Figure 2F:
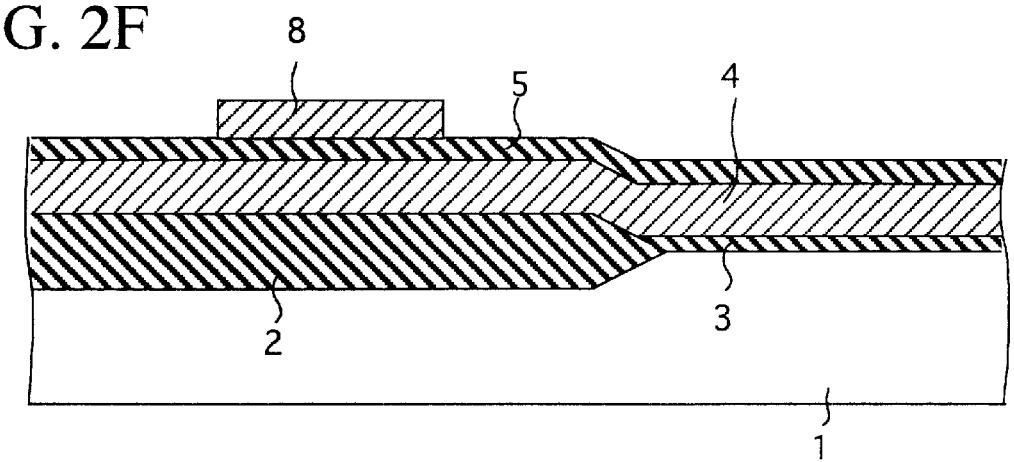
Figure 2G:
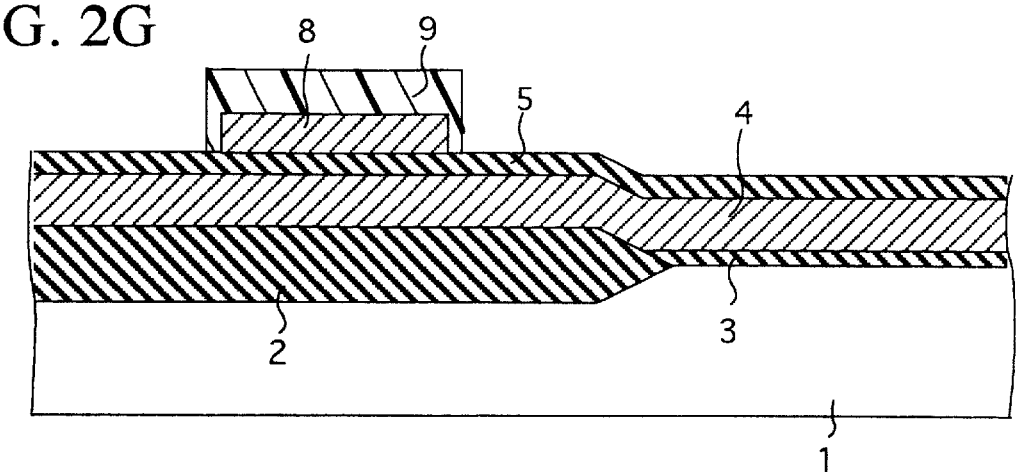
Figure 2H:
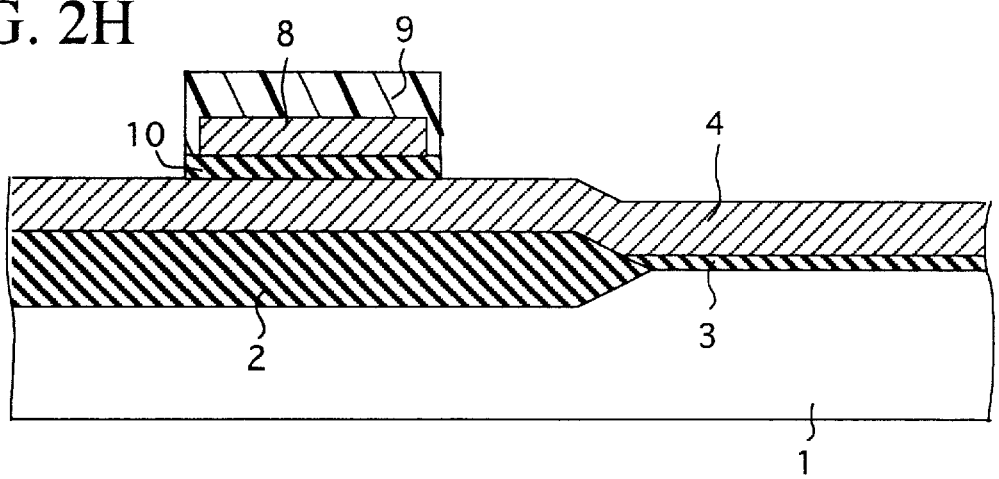
Figure 2I:
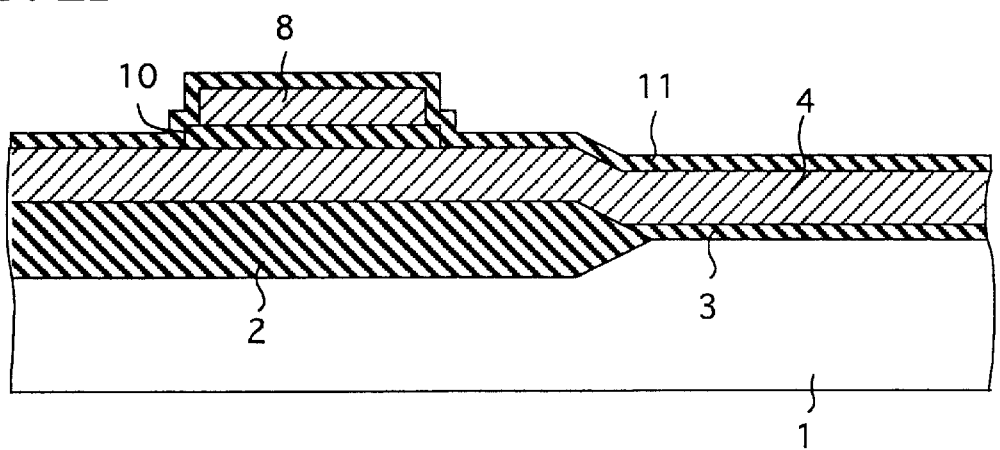
Figure 2J:
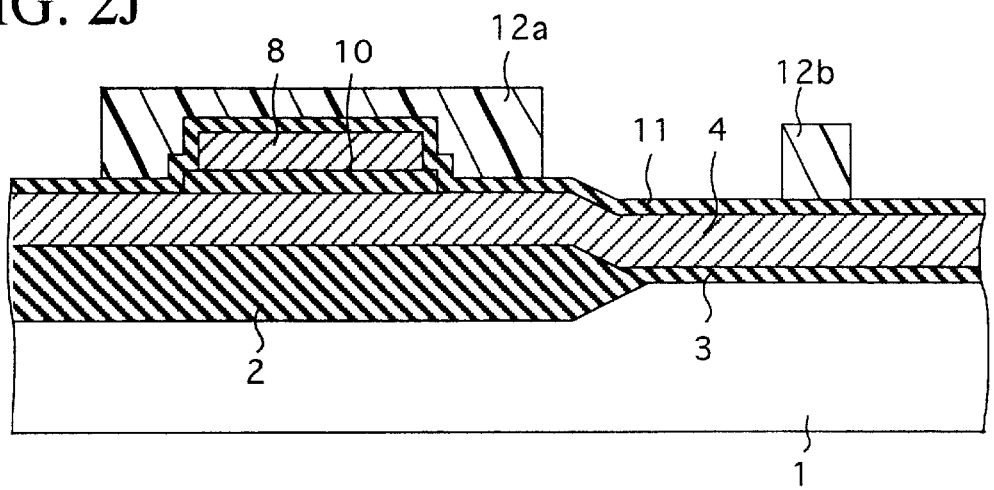
Figure 2K:
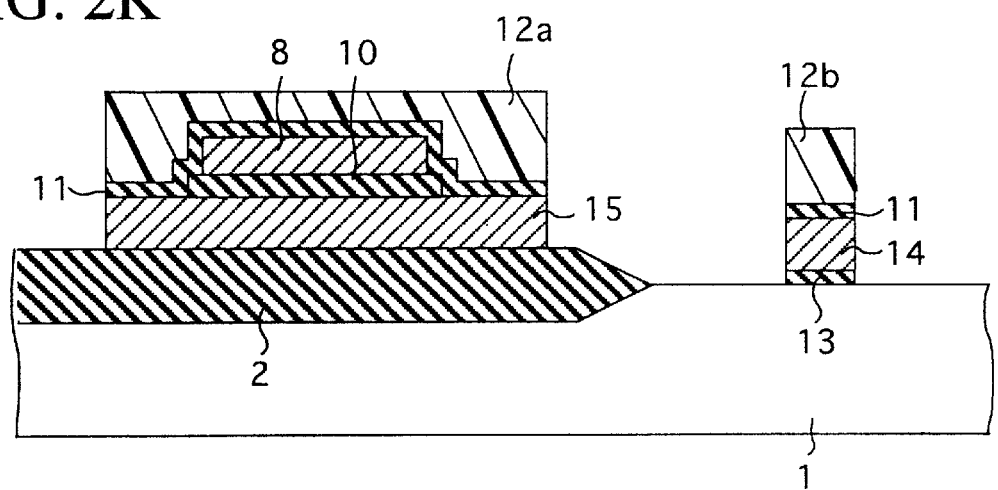
Figure 2L:
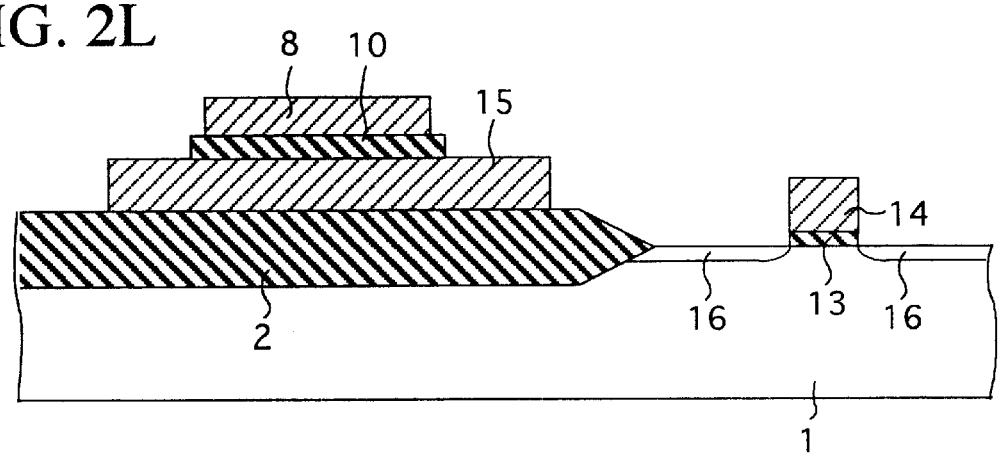
Figure 2M:
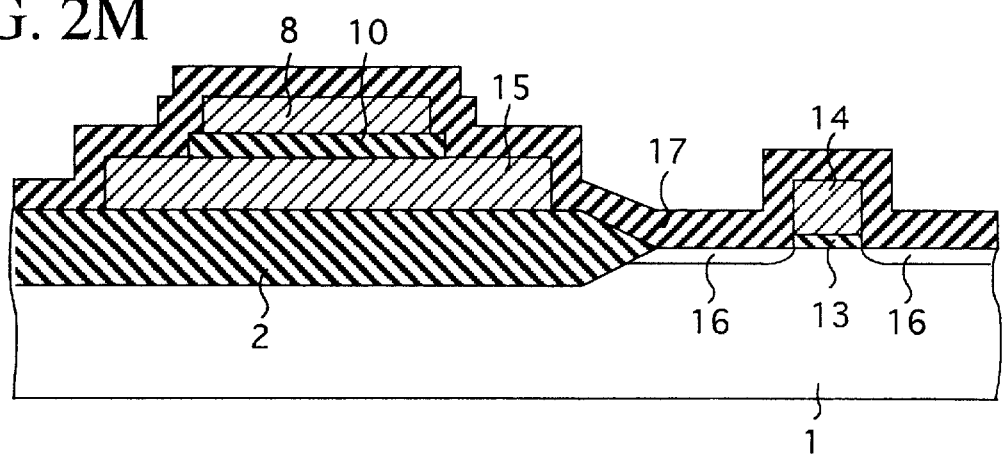
Figure 2N:
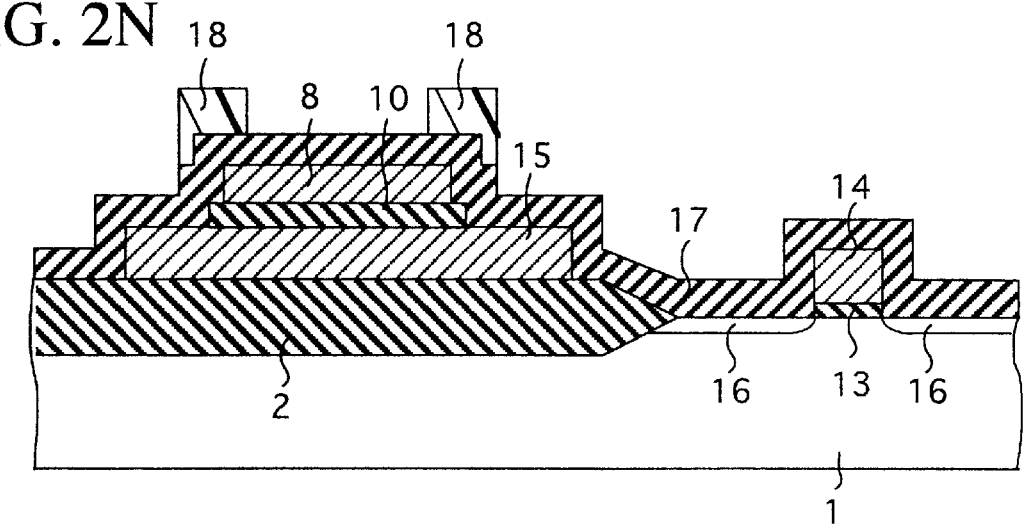
Figure 2O:
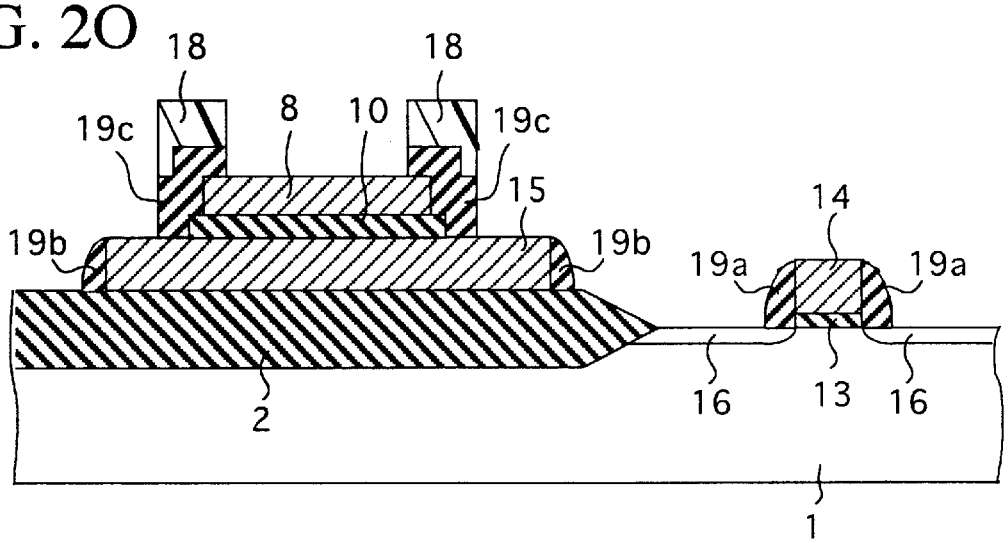
Figure 2P:
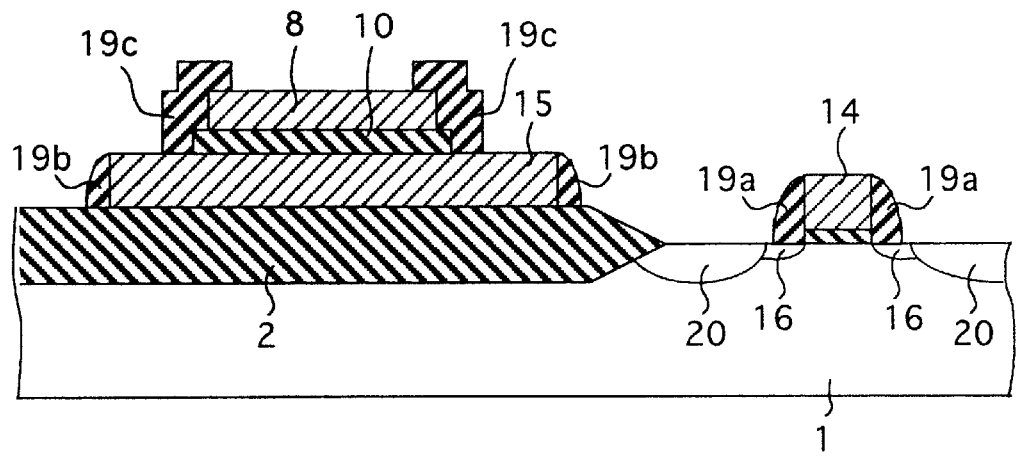
Figure 2Q:
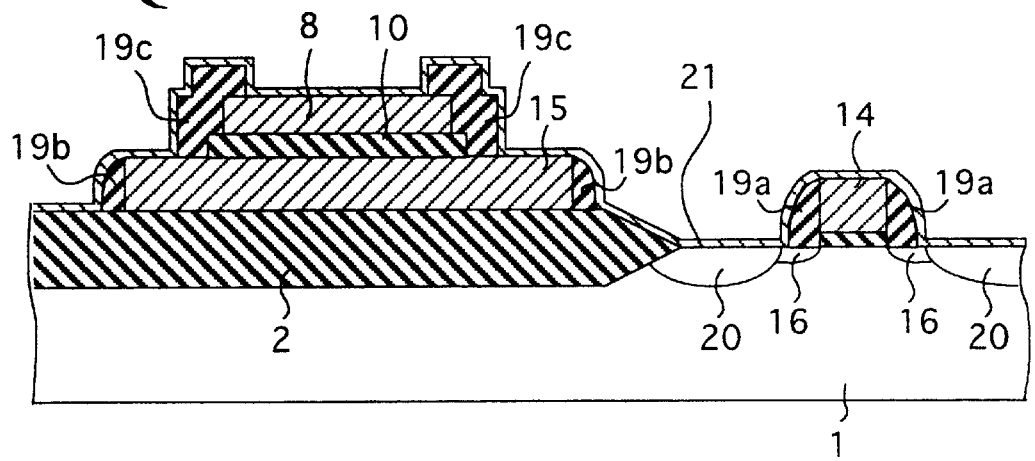
Figure 2R:
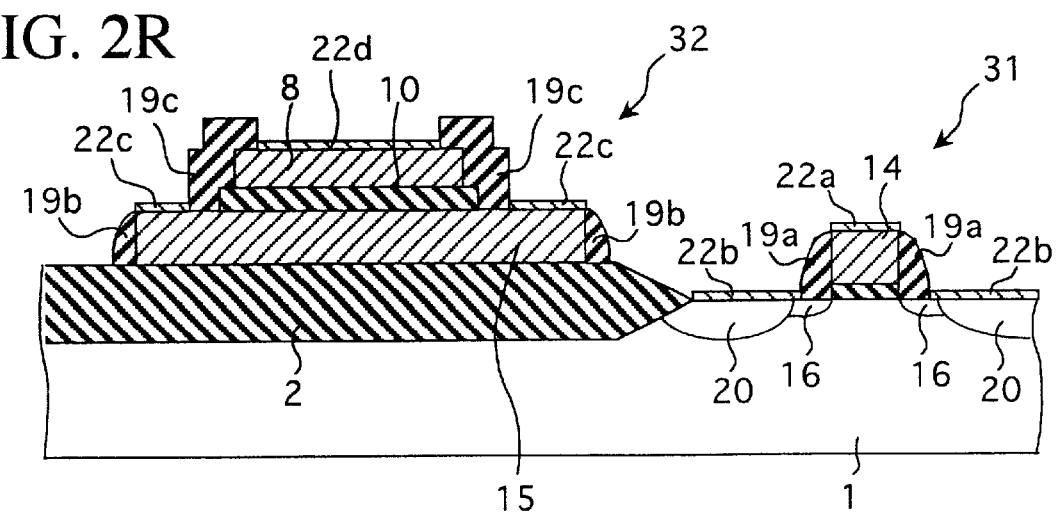

FIGS. 2A to 2R are sectional views showing a manufacturing method of a semiconductor device according to an embodiment of the present invention followed by steps.

First, as shown in FIG. 2A, a P-type silicon substrate 1 is prepared and a thermal oxide film (an element isolation film) 2 of a thickness of about 300 nm is formed in an element isolation region of the silicon substrate 1, by means of a local oxidation of silicon (the "LOCOS") method. Moreover, an oxide film 3 of a thickness of about 5 nm is formed in an element region thereof, by means of a thermal oxidation method.

Next, as shown in FIG. 2B, polysilicon is deposited on the entire surface of the resultant structure to a thickness of about 180 nm, under a condition of a temperature of 620° C. for example, by means of a chemical vapor deposition (hereinafter referred to as a CVD) method. Thus, a polysilicon film 4 is formed.

Next, as shown in FIG. 2C, a silicon oxide is deposited on the polysilicon film 4 to a thickness of about 28 nm, under a condition of a temperature of 800° C. for example, by means of the CVD method. Thus, a silicon oxide film 5 is formed.

Thereafter, as shown in FIG. 2D, amorphous silicon doped with phosphorus (P) is deposited on the silicon oxide film 5 to a thickness of about 100 nm, under a condition of a temperature of 530° C. for example, by means of the CVD method. Thus, an amorphous silicon film 6 is formed. A dopant dose of phosphorus doped to the amorphous silicon film 6 is set at $5 \times 10^{20}$ cm$^{-3}$, for example.

Next, as shown in FIG. 2E, a resist pattern (a resist film) 7 is formed on an upper capacitor electrode forming portion of the amorphous silicon film 6, by use of photoresist. Then, the amorphous silicon film 6 is subjected to dry etching, using the resist pattern 7 as a mask. Thus, an upper capacitor electrode 8 is formed, as shown in FIG. 2F. Thereafter, the resist pattern 7 is removed.

Next, as shown in FIG. 2G, a resist pattern (a resist film) 9 is formed so as to cover the upper capacitor electrode 8 and a periphery thereof by use of photoresist. Then, the silicon oxide film 5 is subjected to wet etching with hydrofluoric acid (HF), using the resist pattern 9 as a mask. Thus, a capacitor insulating film 10 is formed below the resist pattern 9, as shown in FIG. 2H. Thereafter, the resist pattern 9 is removed.

Next, as shown in FIG. 2I, silicon nitride is deposited on the entire surface of the resultant structure to a thickness of about 29 nm by means of a plasma CVD method, thus forming an anti-reflection film 11. This anti-reflection film 11 serves for preventing deterioration of patterning accuracy due to light reflection, in a subsequent photolithography process.

Next, as shown in FIG. 2J, a resist pattern (a resist film) 12a that covers the upper capacitor electrode 8, the capacitor insulating film 10, and the peripheral region thereof, and a resist pattern (a resist film) 12b that covers the upper side of a gate electrode forming portion are formed on the anti-reflection film 11 by use of photoresist. Then, the polysilicon film 4 is subjected to dry etching, using these resist patterns 12a and 12b as masks. Thus, a lower capacitor electrode 15 and a gate electrode 14 are formed, as shown in FIG. 2K.

Also at this time, the oxide film 3 is subjected to etching so that the oxide film 3 only under the gate electrode 14 remains, thus forming a gate oxide film 13. Thereafter, the resist patterns 12a, 12b and the anti-reflection film 11 are removed.

Next, as shown in FIG. 2L, impurities are introduced at a low concentration onto a surface layer in the element region of the silicon substrate 1, using the gate electrode 14 as a mask, thereby forming a low-concentration region (an LDD region) 16 in a self-aligned manner with the gate electrode 14. In a case of an N-type MOS transistor, for example, the low-concentration region 16 is formed by ion implantation of phosphorus (P) under a condition of an acceleration voltage of 10 keV and a dopant dose of $1.5 \times 10^{13}$ cm$^{-2}$.

Thereafter, as shown in FIG. 2M, silicon oxide is deposited on the entire surface of the resultant thickness to the thickness of about 100 nm, under a condition of a temperature of 800° C., by means of the CVD method. Thus, a silicon oxide film 17 is formed.

Next, as shown in FIG. 2N, a resist pattern (a resist film) 18 is formed on the silicon oxide film 17 by use of photoresist, so as to cover a region of the silicon oxide film 17 extending from the inside of a periphery of the upper capacitor electrode 8 to the outside of the periphery thereof.

Thereafter, the silicon oxide film 17 is subjected to anisotropic etching, thereby forming a sidewall 19a that covers a side face of the gate electrode 14, a sidewall 19b that covers a side face of the lower capacitor electrode 15 and a sidewall 19c that covers a region from an upper periphery portion of the upper capacitor electrode 8 to an end portion of the capacitor insulation film 10 as shown in FIG. 2O. Thereafter, the resist pattern 18 is removed.

In this embodiment, as described above, the anisotropic etching is performed in a state where the silicon oxide film 17 is protected by the resist pattern 18, and thus forming the sidewall 19c that covers the side face and the upper periphery portion of the upper capacitor electrode 8. As a consequence, the sidewalls 19a and 19b that respectively cover the side faces of the gate electrode 14 and the lower capacitor electrode 15 are formed as curved faces, whereas the side face of the sidewall 19c is formed as a flat vertical face.

Next, as shown in FIG. 2P, impurities are ion-implanted at a high concentration onto the element region of the silicon substrate 1, using the gate electrode 14 and sidewall 19a collectively as a mask. Thus, a high-concentration impurity region (a source/drain region) 20 is formed in a self-aligned manner with the gate electrode 14 and the sidewall 19a. In a case of an N-type MOS transistor for example, the high-concentration impurity region 20 is formed by ion implantation of arsenic (As) under a condition of an acceleration voltage of 40 keV and a dopant dose of $2.0 \times 10^{15}$ cm$^{-2}$.

Next, as shown in FIG. 2Q, cobalt (Co) is deposited on the entire surface of the resultant structure to a thickness of about 9 nm, by means of the sputtering method. Thus, a Co film 21 is formed. Moreover, a TiN film (not illustrated) to a thickness of about 30 nm is formed on the Co film 21 for a purpose of anti-oxidation. Thereafter, a thermal treatment is performed for 30 seconds in a nitrogen ($N_2$) atmosphere at a temperature of 520° C. Thus, silicide is formed on surfaces of portions of the gate electrode 14, the high-concentration impurity portion 20, the lower capacitor electrode 15 and the upper capacitor electrode 8, the portions that are contacting with the Co film 21.

Subsequently, the TiN film and the Co film 21 are removed with an etchant, which is prepared by mixing of $H_2SO_4$ and $H_2O_2$. As a consequence, silicide films 22a, 22b, 22c and 22d remain on the gate electrode 14, on the high-concentration impurity region 20, on the lower capacitor electrode 15 and on the upper capacitor electrode 8, respectively, as shown in FIG. 2R. Thereafter, an interlayer insulating film (not illustrated) and a wiring (not illustrated) are formed, and a desired circuit is thereby composed.

In the above-mentioned manner, the semiconductor device including a MOS transistor 31 of LDD structure and a stacked capacitor 32 is completed.

According to this embodiment, as shown in FIG. 2N and FIG. 2O, the resist pattern 18 is first formed, which covers the region extending from the inside of the periphery of the upper capacitor electrode 8 to the outside of the periphery thereof, then anisotropic etching is performed. Thus, the sidewall 19c is formed, which covers the side face and the upper peripheral portion of the upper capacitor electrode 8.

In this way, a length from the lower capacitor electrode 15 to the upper electrode 8 along the side face of the sidewall 19c becomes long. Accordingly, even if the silicide film 22c at the side of lower capacitor electrode 15 extends out along the face of the sidewall 19c, or the silicide film 22d at the side of the upper capacitor electrode 8 extends out along the face of the sidewall 19c during the process of forming the silicide films, these silicide films 22c and 22d are still prevented from being contacted to each other.

As a result, occurrence of a short circuit between the upper capacitor electrode 8 and the lower capacitor electrode 15, or occurrence of a current leakage can be certainly prevented even if the thickness of the upper capacitor electrode 8 is made thin. Thus, a semiconductor device of a high quality is obtained.

Next, a description will be made with regard to a modified example of the above embodiment.

In the above embodiment, an element isolation region is formed with a thermal oxide film by the LOCOS method. However, the element isolation film may be also formed by the shallow trench isolation method. In the shallow trench isolation method, a groove is formed on a silicon substrate, and an insulator such as a silicon oxide is buried into the groove, thus forming the element isolation film.

Figure 3A:
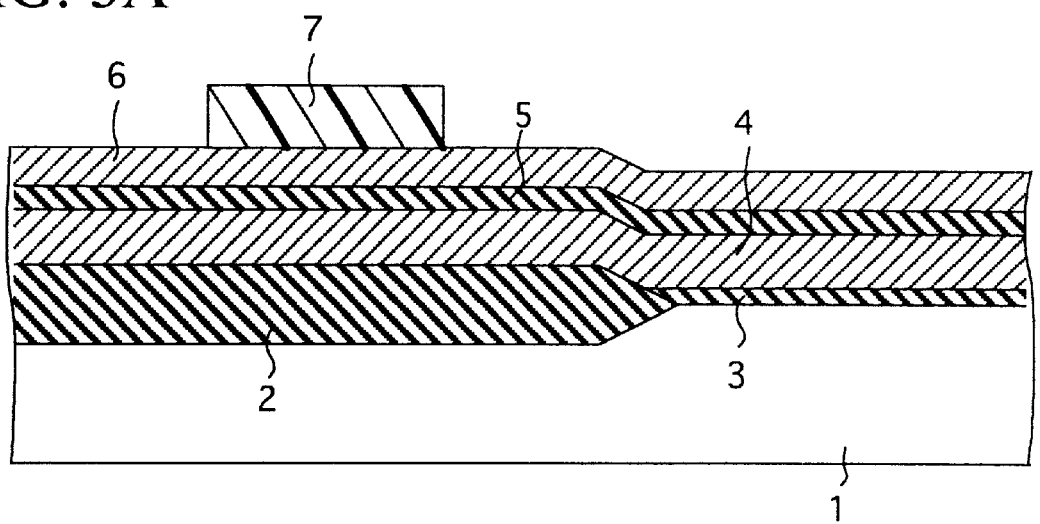
FIGS. 3A and 3B are sectional views showing a modified example of the manufacturing method of the semiconductor device according to the embodiment of the present invention.
Figure 3B:
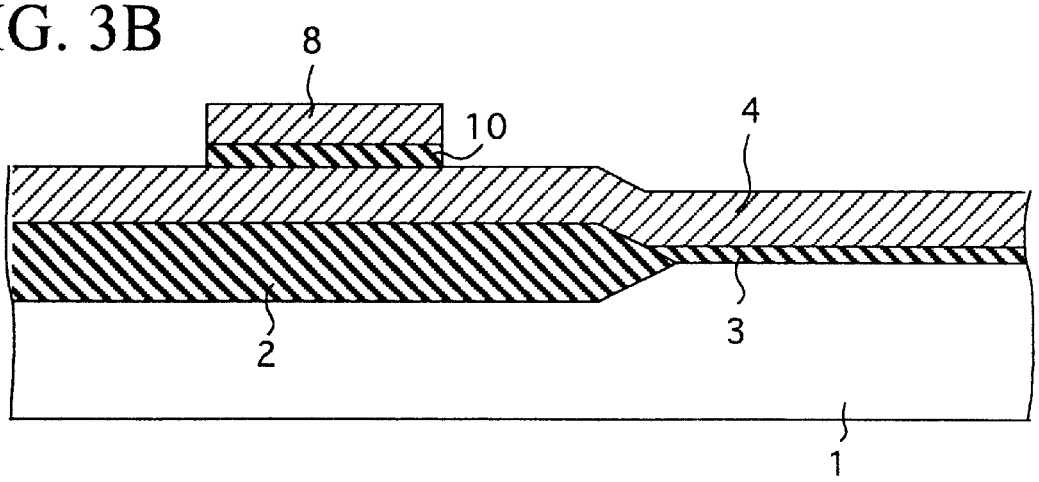

Moreover, in the above embodiment, a size of the capacitor insulating film 10 is made larger than that of the upper capacitor electrode 8. This is purported to control a capacity of the capacitor insulating film 10. However, as shown in FIG. 3A and FIG. 3B, the upper capacitor electrode 8 and the capacitor insulating film 10 may be formed by etching the amorphous silicon film 6 and the silicon oxide film 5, using the resist pattern 7 as a mask. In this way, the steps as described in FIG. 2F and FIG. 2G may be curtailed, thus simplifying the manufacturing steps.

What is claimed is:

1. A manufacturing method of a semiconductor device comprising the steps of:

forming an insulative element isolation film on a semiconductor substrate;

forming a first silicon film on the entire surface of said semiconductor substrate;

forming a first insulating film on said first silicon film;

forming a second silicon film on said first insulating film;

forming a capacitor insulating film and an upper capacitor electrode above an upper side of said element isolation film by patterning said first insulating film and said second silicon film;

forming a first resist film including a first pattern that covers said upper capacitor electrode and said capacitor insulating film, and a second pattern that covers a gate electrode formation region;

forming a lower capacitor electrode and a gate electrode by patterning said first silicon film by use of said first resist film as a mask;

introducing first impurities onto a surface layer of said semiconductor substrate at both side portions of said gate electrode after removing said first resist film;

forming a second insulating film on the entire surface of the resultant structure;

forming a second resist film on said second insulating film, said second resist film covering a region extending from the inside of a periphery of said upper capacitor electrode to the outside of the periphery thereof;

anisotropically etching said second insulating film to form sidewalls on a side portion of said gate electrode, a side portion of said lower capacitor electrode and a bottom portion of said second resist film, respectively;

removing said second resist film;

introducing second impurities onto said semiconductor substrate using said gate electrode and said sidewalls on said both sides thereof collectively as a mask;

forming a metallic film on the entire surface of the resultant structure and further allowing metallic atoms in said metallic film to react with silicon contained in said semiconductor substrate, said gate electrode, said lower capacitor electrode and said upper capacitor electrode, thus forming a silicide film; and removing said metallic film while leaving said silicide film.

2. The manufacturing method of a semiconductor device according to claim 1, wherein the step of forming said upper capacitor electrode by patterning said second silicon film is carried out separately from the step of forming said capacitor insulating film by patterning said first insulating film.

3. The manufacturing method of a semiconductor device according to claim 1, wherein said upper capacitor electrode and said capacitor insulating film are formed by patterning said second silicon film and said first insulating film with the same mask.

4. The manufacturing method of a semiconductor device according to claim 1, wherein said insulative element isolation film is formed by the local oxidation of silicon method.

5. The manufacturing method of a semiconductor device according to claim 1, wherein said insulative element isolation film is formed by the shallow trench isolation method.

6. The manufacturing method of a semiconductor device according to claim 1, wherein said second silicon film to be formed into said upper capacitor electrode has a film thickness between 80 nm to 180 nm.

* * * * *